(12) United States Patent
Shimbo (10) Patent No.: US 9,899,381 B2
(45) Date of Patent: Feb. 20, 2018

(54) SEMICONDUCTOR INTEGRATED CIRCUIT DEVICE HAVING A STANDARD CELL WHICH INCLUDES A FIN

(71) Applicant: SOCIONEXT INC., Kanagawa (JP)

(72) Inventor: Hiroyuki Shimbo, Kyoto (JP)

(73) Assignee: SOCIONEXT INC., Kanagawa (JP)

( * ) Notice: Subject to any disclaimer, the term of this patent is extended or adjusted under 35 U.S.C. 154(b) by 0 days.

(21) Appl. No.: 15/049,680

(22) Filed: Feb. 22, 2016

(65) Prior Publication Data

US 2016/0172360 A1    Jun. 16, 2016

(30) Foreign Application Priority Data

Aug. 23, 2013    (JP) .................. 2013-173739

(51) Int. Cl.

| | |
|---|---|
| *H01L 27/088* | (2006.01) |
| *H01L 21/8234* | (2006.01) |
| *H01L 27/02* | (2006.01) |
| *H01L 27/118* | (2006.01) |
| *H01L 21/84* | (2006.01) |
| *H01L 27/12* | (2006.01) |
| *H01L 23/528* | (2006.01) |

(52) U.S. Cl.
CPC .. *H01L 27/0886* (2013.01); *H01L 21/823431* (2013.01); *H01L 21/845* (2013.01); *H01L 23/528* (2013.01); *H01L 27/0207* (2013.01); *H01L 27/11807* (2013.01); *H01L 27/1211* (2013.01); *H01L 2924/0002* (2013.01)

(58) Field of Classification Search
CPC ......... H01L 21/823431; H01L 27/0207; H01L 27/0886; H01L 21/845; H01L 23/528; H01L 29/6681; H01L 29/66545; H01L 29/785; H01L 29/66795; H01L 27/0924; H01L 21/823821
See application file for complete search history.

(56) References Cited

U.S. PATENT DOCUMENTS

| | | | |
|---|---|---|---|
| 2007/0004147 A1 | 1/2007 | Toubou et al. | |
| 2007/0210405 A1* | 9/2007 | Tsutsumi | H01L 27/118 257/499 |
| 2008/0203468 A1 | 8/2008 | Cheng et al. | |

(Continued)

FOREIGN PATENT DOCUMENTS

| | | |
|---|---|---|
| JP | 09-289251 A | 11/1997 |
| JP | 2007-012855 A | 1/2007 |

(Continued)

OTHER PUBLICATIONS

International Search report dated May 27, 2014, issued in corresponding International Application No. PCT/JP2014/002237. (w/ partial English translation).

*Primary Examiner* — Khiem D Nguyen
(74) *Attorney, Agent, or Firm* — McDermott Will & Emery LLP (57) ABSTRACT

Disclosed herein is a semiconductor integrated circuit device including a standard cell with a fin extending in a first direction. The fin and a gate line extending in a second direction perpendicular to the first direction and provided on the fin constitute an active transistor. The fin and a dummy gate line provided in parallel with the gate line constitute a dummy transistor. The active transistor shares a node as its source or drain with the dummy transistor.

20 Claims, 12 Drawing Sheets

(56) References Cited

U.S. PATENT DOCUMENTS

| | | |
|---|---|---|
| 2009/0041406 A1* | 2/2009 | Schulz .............. H01L 31/0232 385/14 |
| 2009/0230483 A1 | 9/2009 | Mizumura et al. |
| 2010/0006896 A1* | 1/2010 | Uemura ............ H01L 27/11803 257/202 |
| 2010/0127333 A1 | 5/2010 | Hou et al. |
| 2010/0187699 A1 | 7/2010 | Nishimura et al. |
| 2010/0287518 A1 | 11/2010 | Becker |
| 2013/0126978 A1 | 5/2013 | Becker et al. |
| 2014/0061801 A1 | 3/2014 | Doornbos et al. |
| 2014/0097493 A1 | 4/2014 | Baek et al. |
| 2014/0117454 A1* | 5/2014 | Liu .................... H01L 29/6681 257/368 |
| 2014/0145263 A1* | 5/2014 | Cheng .............. H01L 21/76205 257/347 |
| 2014/0167172 A1* | 6/2014 | Chen .................. H01L 29/6681 257/368 |
| 2014/0252476 A1* | 9/2014 | Chang ................ H01L 29/0692 257/347 |
| 2014/0258961 A1 | 9/2014 | Ke et al. |

FOREIGN PATENT DOCUMENTS

| | | |
|---|---|---|
| JP | 2008-219002 A | 9/2008 |
| JP | 2009-218499 A | 9/2009 |
| JP | 2010-016258 A | 1/2010 |
| JP | 2010-021469 A | 1/2010 |
| JP | 2010-123947 A | 6/2010 |

\* cited by examiner

SEMICONDUCTOR INTEGRATED CIRCUIT DEVICE HAVING A STANDARD CELL WHICH INCLUDES A FIN

CROSS-REFERENCE TO RELATED APPLICATIONS

This is a continuation of International Application No. PCT/JP2014/002237 filed on Apr. 21, 2014, which claims priority to Japanese Patent Application No. 2013-173739 filed on Aug. 23, 2013. The entire disclosures of these applications are hereby incorporated by reference.

BACKGROUND

The present disclosure relates to a semiconductor integrated circuit device including a standard cell with a transistor having a fin structure.

A standard cell design has been known as a method of forming a semiconductor integrated circuit on a semiconductor substrate. The standard cell design refers to a method of designing a large-scale integrated circuit (LSI) chip by providing in advance, as standard cells, unit logic elements having particular logical functions (for example, an inverter, a latch, a flip-flop, and a full adder), laying out those standard cells on a semiconductor substrate, and connecting those standard cells together through a routing process.

Figure 12:
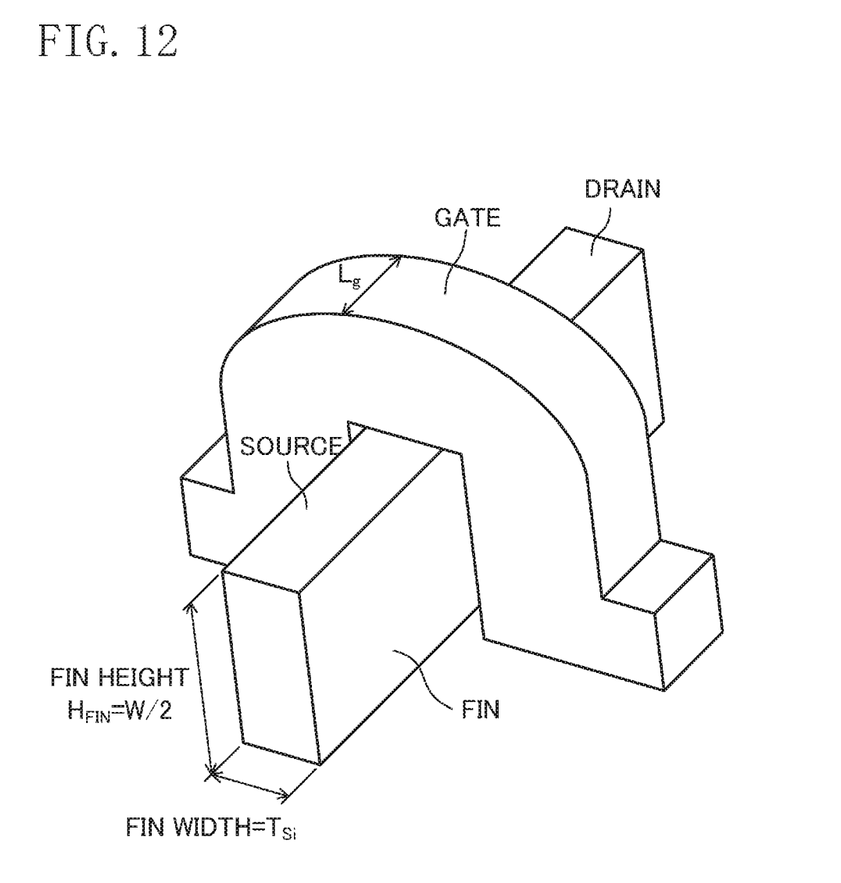
FIG. 12 schematically illustrates a fin transistor.

Recently, it has been proposed to utilize transistors with a fin structure (hereinafter referred to as "fin transistors") in the field of semiconductor devices. FIG. 12 schematically illustrates a fin transistor. Unlike a metal oxide semiconductor (MOS) transistor having a two-dimensional structure, its source and drain have a raised, three-dimensional structure called "fin." Its gate is disposed so as to wrap around a channel region defined between the source and drain in this fin. In this fin structure, the channel region is defined by three surfaces of the fin, thereby improving channel controllability significantly compared to conventional ones. As a result, various advantages, including reducing the leakage power, increasing the ON-state current, and lowering the operating voltage, are achieved. This leads to improving the performance of the semiconductor integrated circuit.

Japanese Unexamined Patent Application Publication No. 2008-219002 teaches, as an improvement for the process step of making such a fin structure, performing selective etching by forming the fin in the same direction as the crystal-growing direction of a silicon substrate.

SUMMARY

In such a fin structure, the fin is not necessarily formed uniformly along its entire length. That is to say, the width of the fin is not necessarily the same in the length direction, but varies to some extent. In particular, the fin width tends to taper toward the terminal portion thereof. Thus, if a transistor is formed near the terminal portion of the fin, chances of achieving the desired performance are slim.

If a wire or contact is connected to the terminal portion of the fin, the degree of electrical contact between the fin and the wire or contact may decrease due to such a deformation of the terminal portion of the fin, or mask misalignment of the wire or contact, resulting in a variation in resistance characteristic. This variation may cause a decrease in the yield of semiconductor chips.

In view of the foregoing background, it is therefore an object of the present disclosure to reduce, in a semiconductor integrated circuit device including a standard cell with a fin transistor, the influence caused by such tapering of the terminal portion of the fin and eventually reduce a variation in performance between the devices.

An aspect of the present disclosure provides a semiconductor integrated circuit device including a standard cell having a fin extending in a first direction. The standard cell includes: an active transistor including the fin and a gate line extending in a second direction perpendicular to the first direction and provided on the fin; and a dummy transistor including the fin and a dummy gate line provided on the fin in parallel with the gate line. The active transistor shares its source or drain with the dummy transistor.

According to this aspect of the present disclosure, by providing the dummy transistor, the source or drain of the active transistor may be arranged distant from the terminal portion of the fin. That is to say, the node of the active transistor is not positioned at the terminal portion of the fin that is highly likely to have a narrower fin width. This allows for eliminating the influence caused by tapering of the terminal portion of the fin on the active transistor, thus reducing the variation in performance between the active transistors.

The present disclosure allows for reducing, in a semiconductor integrated circuit device including a standard cell with a fin transistor, the influence caused by tapering of the terminal portion of the fin. This thus allows for reducing a variation in performance between the semiconductor integrated circuit devices.

DETAILED DESCRIPTION

Embodiments of the present disclosure will now be described in detail with reference to the accompanying drawings. In the following description of embodiments, it is assumed that a semiconductor integrated circuit device includes a plurality of standard cells, at least some of which includes a fin transistor.

Also, in this specification, a transistor which contributes to a logical function of the standard cells will be hereinafter referred to as an "active transistor," and a transistor other than such an active transistor, i.e., a transistor which does not contribute to any logical function of the standard cells will be hereinafter referred to as a "dummy transistor."

First Embodiment

Figure 1:
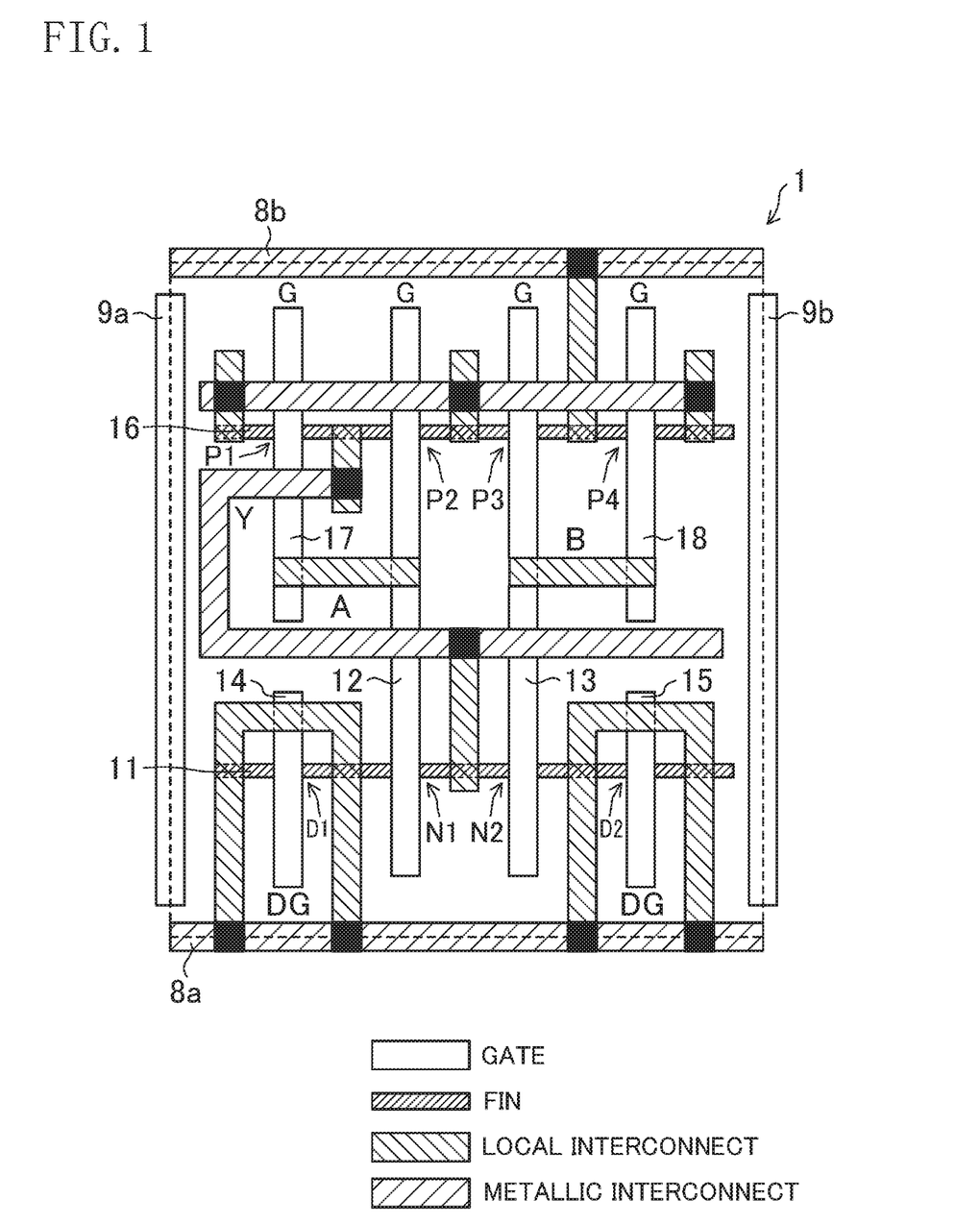
FIG. 1 is a plan view illustrating an exemplary layout design for a standard cell included in a semiconductor integrated circuit device according to a first embodiment.
Figure 2:
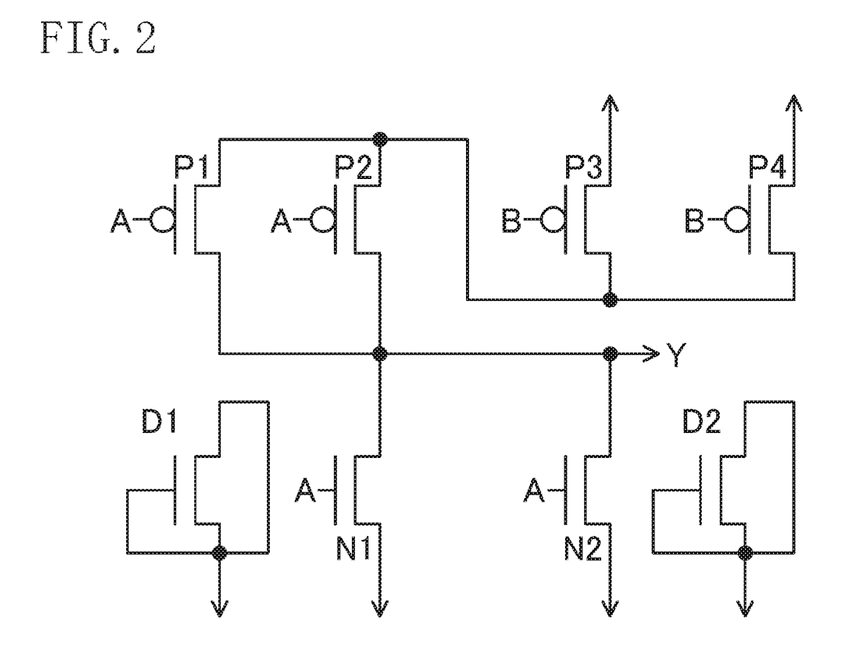
FIG. 2 is a circuit diagram of the standard cell of FIG. 1.

FIG. 1 is a plan view illustrating an exemplary layout design of a standard cell included in a semiconductor integrated circuit device according to a first embodiment. FIG. 2 is a circuit diagram of the standard cell of FIG. 1. As illustrated in FIG. 2, a standard cell 1 of FIG. 1 is a cell performing the function of a two-input NOR circuit. In FIG. 1 and other plan views, a fin transistor includes a fin and a gate formed on the fin. A local interconnect is formed so as to be located on the fin or gate in a region in which the local interconnect overlaps with the fin or gate when viewed in plan, and is electrically connected to the fin or gate. A metallic interconnect is located over the local interconnect, and is connected to the local interconnect through a contact. In FIG. 1, the fin is hatched to allow the reader to find the fin easily on the drawing. However, the fin is not hatched at its portion located under the gate. The local interconnect and metallic interconnect are also hatched differently, and a portion at which the metallic interconnect and local interconnect are connected together through a contact is indicated by the solid square. The other plan views are illustrated in the same or similar manner.

As illustrated in FIG. 1, the standard cell 1 has fins 11 and 16 which extend in the lateral direction on the paper (i.e., a first direction). The fin 11 is used to form an n-channel transistor in an n-type region, while the fin 16 is used to form a p-channel transistor in a p-type region. In other words, gate lines 12 and 13 extending in the vertical direction on the paper (i.e., a second direction perpendicular to the first direction) and provided on the fin 11 respectively constitute, together with the fin 11, n-channel transistors N1 and N2 functioning as active transistors. The n-channel transistor N1 shares its drain with the n-channel transistor N2. Also, gate lines 17, 12, 13, and 18 extending in the vertical direction on the paper and provided on the fin 16 respectively constitute, together with the fin 16, p-channel transistors P1, P2, P3, and P4 functioning as active transistors.

A ground line 8a supplying a ground potential is disposed at the lower end of the standard cell 1 so as to extend in the lateral direction on the paper. A power supply line 8b supplying a power supply potential is disposed at the upper end of the standard cell 1 so as to extend in the lateral direction on the paper. Dummy gate lines 9a and 9b are respectively disposed at the left and right ends of the standard cell 1 so as to extend in the vertical direction on the paper.

In addition, dummy transistors D1 and D2 are further formed on the fin 11. That is to say, the fin 11 and a dummy gate line 14 provided on the fin 11 in parallel with the gate line 12 constitute the dummy transistor D1. The n-channel transistor N1 shares its source, to which the ground potential is supplied as an exemplary power supply potential, with the dummy transistor D1. Also, the fin 11 and a dummy gate line 15 provided on the fin 11 in parallel with the gate line 13 constitute the dummy transistor D2. The n-channel transistor N2 shares its source, to which the ground potential is supplied, with the dummy transistor D2. The sources, drains, and gates of the dummy transistors D1 and D2 are all connected to the ground line 8a functioning as an exemplary power supply line.

The n-channel transistor N1 shares its source with the dummy transistor D1, and shares its drain with the n-channel transistor N2 functioning as a third transistor. The n-channel transistor N2 shares its source with the dummy transistor D2, and shares its drain with the n-channel transistor N1 functioning as a third transistor. That is to say, in the layout design of FIG. 1, in the n-type region, each of the active transistors N1 and N2 shares both nodes as its source and drain with associated ones of the other transistors.

According to the layout design of FIG. 1, the dummy transistors D1 and D2 are arranged near the respective terminal portions of the fin 11, and the n-channel transistors N1 and N2 functioning as active transistors are arranged distant from those terminal portions of the fin 11. That is to say, the active transistors N1 and N2 are not positioned at any of the terminal portions of the fin 11 that are highly likely to have a narrower fin width. This allows for eliminating the influence caused by tapering of the terminal portions of the fin 11 on the active transistors N1 and N2, thus reducing a variation in performance between the active transistors N1 and N2. As a result, this allows for improving electrical contact between the active transistors N1 and N2 and the local interconnect and increasing the yield of the semiconductor chips.

Figure 3:
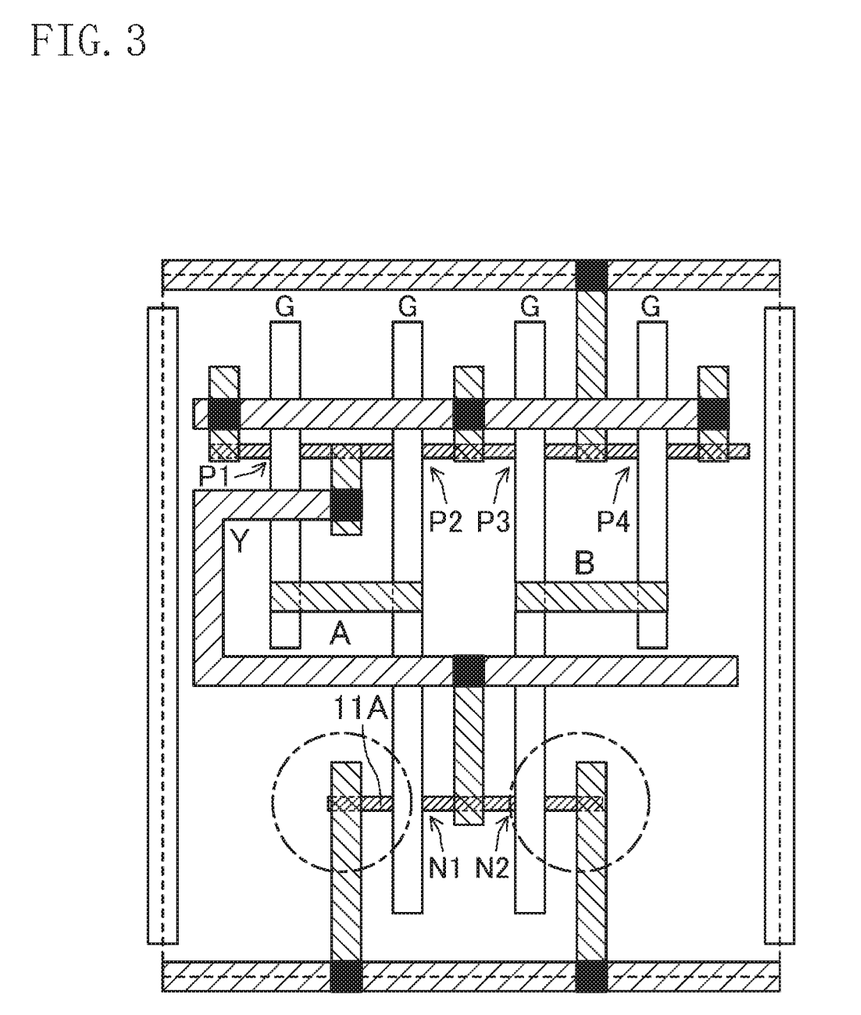
FIG. 3 is a plan view illustrating a comparative example of the layout design of FIG. 1.

FIG. 3 is a plan view illustrating a comparative example of the layout design of FIG. 1. According to the layout design of FIG. 3, a fin 11A shorter than the fin 11 is disposed, and the n-channel transistors N1 and N2 are disposed near respective terminal portions of that fin 11A (as indicated by the one-dot-chain circles). No dummy transistors are formed in this comparative example.

It is not necessary to provide the dummy transistors D1 and D2 if the logical function of the NOR circuit of FIG. 2 has only to be implemented. Therefore, if the layout is designed just to implement the logical function of the NOR circuit of FIG. 2 without taking the influence caused by tapering of the terminal portions of the fin into account, the layout design may have no dummy transistors D1 and D2, as illustrated in FIG. 3.

However, in the layout design of FIG. 3, the n-channel transistors N1 and N2 are disposed at the respective terminal portions of the fin 11A, and therefore, may be affected by tapering of the terminal portions, which could prevent the circuit from achieving the desired performance. Thus, use of the layout design of FIG. 3 increases the chances of causing a variation in performance between the semiconductor chips, or causing a decrease in their yield. In particular, in cells constituting a clock tree through which a clock signal propagates, such a variation in performance needs to be reduced. Therefore, it is effective to adopt the layout design of FIG. 1 instead of the layout design of FIG. 3. This advantage of reducing such a variation is achievable in not only the cells constituting a clock tree but also other kinds of cells as well.

In this embodiment, each n-channel transistor functioning as an active transistor shares its source with its associated dummy transistor. However, the present disclosure is not limited thereto. For example, each active transistor may share its drain with its associated dummy transistor. Alternatively, each p-channel transistor functioning as an active transistor may share one of its source or drain with its associated dummy transistor. In that case, the other of the active transistor's source or drain shared with the dummy transistor may, or need not, be shared with another dummy transistor.

Second Embodiment

Figure 4:
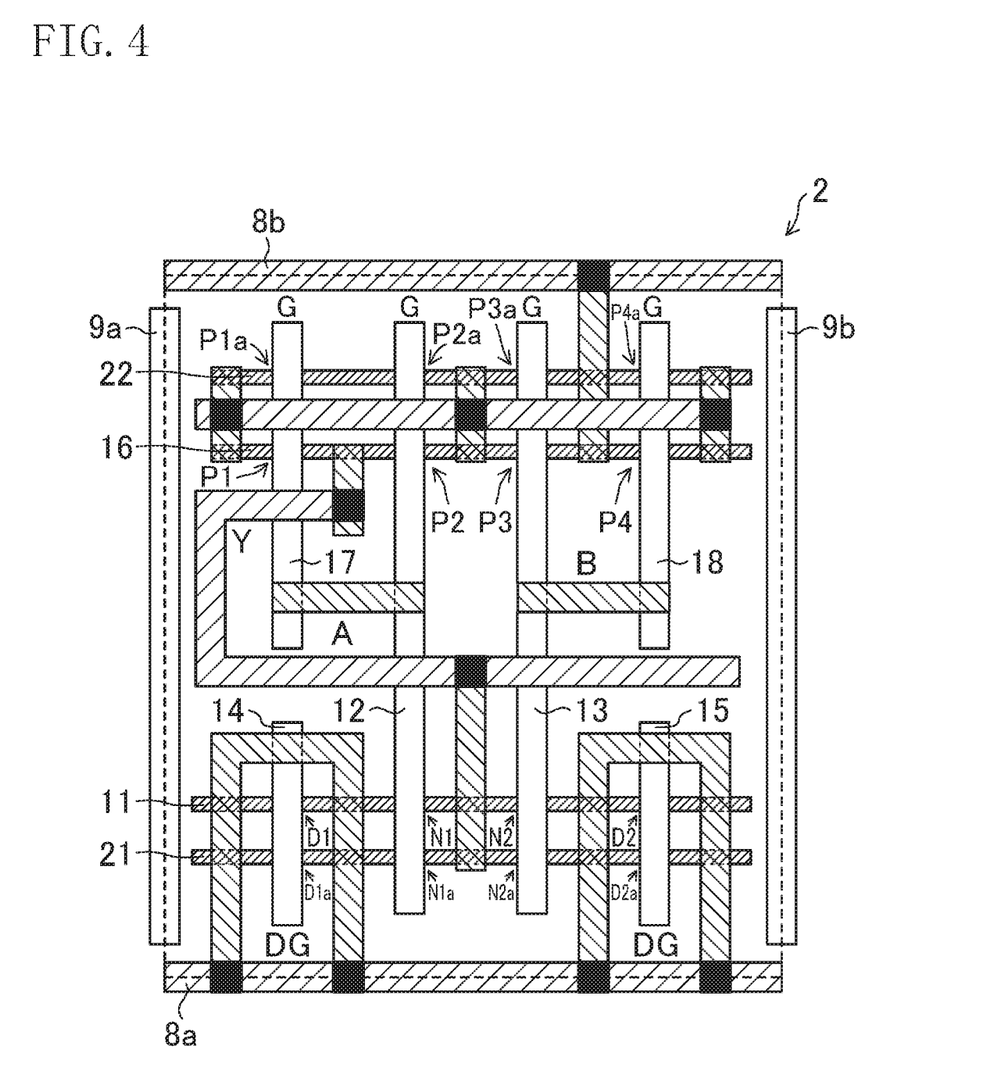
FIG. 4 is a plan view illustrating an exemplary layout design for a standard cell included in a semiconductor integrated circuit device according to a second embodiment.

FIG. 4 is a plan view illustrating an exemplary layout design of a standard cell included in a semiconductor integrated circuit device according to a second embodiment. The standard cell 2 illustrated in FIG. 4 is a cell performing the function of a two-input NOR circuit illustrated in FIG. 2. Each transistor in FIG. 2 includes two fins.

As illustrated in FIG. 4, the standard cell 2 has fins 11, 16, 21, and 22 which extend in the lateral direction on the paper (i.e., a first direction). The fins 11 and 21 are used to form an n-channel transistor in an n-type region, while the fins 16 and 22 are used to form a p-channel transistor in a p-type region. In other words, gate lines 12 and 13 extending in the vertical direction on the paper (i.e., a second direction perpendicular to the first direction) and provided on the fin 11 respectively constitute, together with the fin 11, n-channel transistors N1 and N2 functioning as active transistors. The gate lines 12 and 13 extending over the fin 21 which serves as a second fin respectively constitute, together with the fin 21, n-channel transistors N1a and N2a functioning as second active transistors.

Also, gate lines 17, 12, 13, and 18 extending in the vertical direction on the paper and provided on the fin 16 respectively constitute, together with the fin 16, p-channel transistors P1, P2, P3, and P4 functioning as active transistors. Also, the gate lines 17, 12, 13, and 18 extending over the the fin 22 respectively constitute, together with the fin 22, p-channel transistors P1a, P2a, P3a, and P4a.

A ground line 8a supplying a ground potential is disposed at the lower end of the standard cell 2 so as to extend in the lateral direction on the paper. A power supply line 8b supplying a power supply potential is disposed at the upper end of the standard cell 2 so as to extend in the lateral direction on the paper. Dummy gate lines 9a and 9b are respectively disposed at the left and right ends of the standard cell 2 so as to extend in the vertical direction on the paper.

In addition, dummy transistors D1 and D2 are further formed on the fin 11, and dummy transistors D1a and D2a are further formed on the fin 21. That is to say, the fin 11 and a dummy gate line 14 provided on the fin 11 in parallel with the gate line 12 constitute the dummy transistor D1. Also, the fin 11 and a dummy gate line 15 provided on the fin 11 in parallel with the gate line 13 constitute the dummy transistor D2. The n-channel transistor N1 shares its source, to which the ground potential is supplied, with the dummy transistor D1. The n-channel transistor N2 shares its source, to which the ground potential is supplied, with the dummy transistor D2. Furthermore, the fin 21 and a dummy gate line 14 provided on the fin 21 constitute the dummy transistor D1a. Also, the fin 21 and a dummy gate line 15 extending over the fin 21 constitute the dummy transistor D2a. The n-channel transistor N1a shares its source, to which the ground potential is supplied, with the dummy transistor D1a. The n-channel transistor N2a shares its source, to which the ground potential is supplied, with the dummy transistor D2a. The source, drain, and gate of each of the dummy transistors D1, D2, D1a, and D2a are all connected to the ground line 8a.

The n-channel transistor N1 shares its source with the dummy transistor D1, and shares its drain with the n-channel transistor N2. The n-channel transistor N2 shares its source with the dummy transistor D2, and shares its drain with the n-channel transistor N1. The n-channel transistor N1a shares its source with the dummy transistor D1a, and shares its drain with the n-channel transistor N2a. The n-channel transistor N2a shares its source with the dummy transistor D2a, and shares its drain with the n-channel transistor N1a. That is to say, in the layout design of FIG. 4, in the n-type region, each of all the active transistors N1, N2, N1a, and N2a has both nodes as its source and drain with associated ones of the other transistors.

According to the layout design of FIG. 4, the dummy transistors D1 and D2 are arranged near the respective terminal portions of the fin 11, and the n-channel transistors N1 and N2 are arranged distant from those terminal portions of the fin 11. That is to say, the active transistors N1 and N2 are not positioned at the terminal portions of the fin 11 that are highly likely to have a narrower fin width. Likewise, the dummy transistors D1a and D2a are arranged near the respective terminal portions of the fin 21, and the n-channel transistors N1a and N2a are arranged distant from those terminal portions of the fin 21. That is to say, the active transistors N2a and N2a are not positioned at the terminal portions of the fin 21 that are highly likely to have a narrower fin width. This allows for eliminating the influence caused by tapering of the terminal portions of the fin 11 on the active transistors N1 and N2 and the influence caused by tapering of the terminal portions of the fin 21 on the active transistors N1a and N2a, thus reducing a variation in performance between the active transistors N1, N2, N1a, and N2a. As a result, this allows for improving electrical contact between the active transistors N1, N2, N1a and N2a and the local interconnects and increasing the yield of the semiconductor chips.

Figure 5:
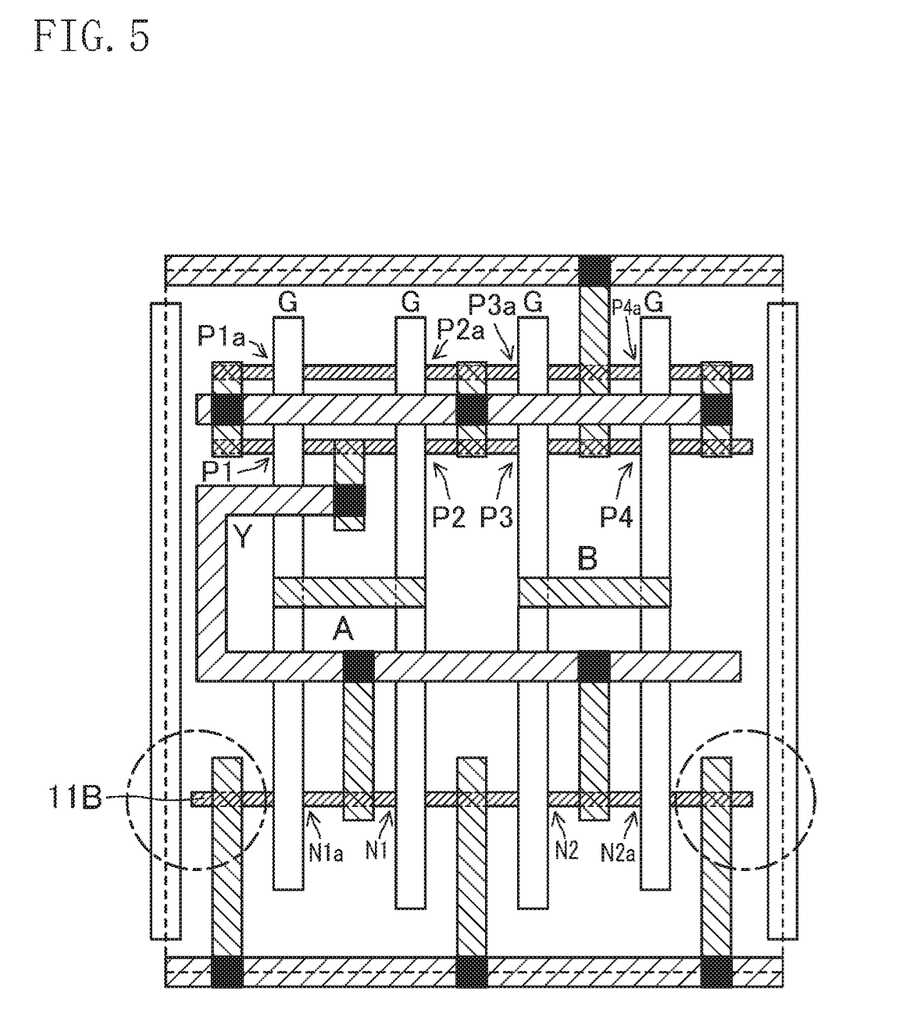
FIG. 5 is a plan view illustrating a comparative example of the layout design of FIG. 4.

FIG. 5 is a plan view illustrating a comparative example of the layout design of FIG. 4. In the layout design of FIG. 5, only one fin 11B is provided to form n-channel transistors, and the n-channel transistors N1a and N2a are disposed near the respective terminal portions of the fin 11B (as indicated by the one-dot-chain circles). No dummy transistors are formed.

In a situation where the NOR circuit illustrated in FIG. 2 (except the dummy transistors D1 and D2) is formed using two fins for each transistor, if the layout is designed without taking the influence caused by tapering of the terminal portions of the fin into account, the layout design will be as illustrated in FIG. 5.

However, in the layout design of FIG. 5, the n-channel transistors N1a and N2a are disposed near the respective terminal portions of the fin 11B, and therefore, may be affected by tapering of the terminal portions, which could prevent the circuit from achieving the desired performance. Thus, use of the layout design of FIG. 5 increases the chances of causing a variation in performance between the semiconductor chips, or causing a decrease in their yield. In particular, in cells constituting a clock tree through which a clock signal propagates, such a variation in performance needs to be reduced. Therefore, it is effective to adopt the layout design of FIG. 4 instead of the layout design of FIG. 5. This advantage of reducing such a variation is achievable in not only the cells constituting a clock tree but also other kinds of cells as well.

Figure 6:
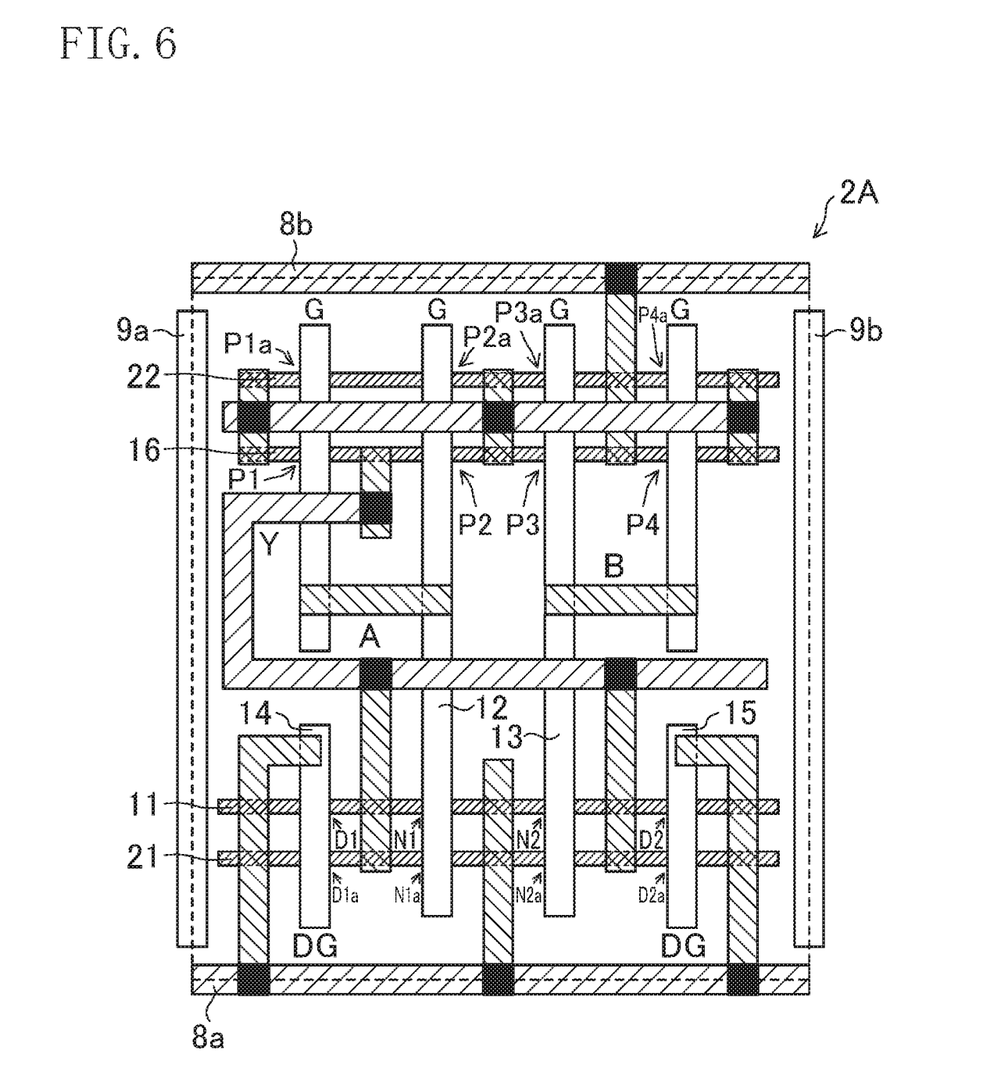
FIG. 6 is a plan view illustrating another exemplary layout design for a standard cell according to the second embodiment.

FIG. 6 is a plan view illustrating another exemplary layout design for a standard cell according to this embodiment. Although the standard cell 2A shown in FIG. 6 has the same circuit configuration as the one shown in FIG. 4, the n-channel transistors N1, N2, N1a, and N2a share their drains with the dummy transistors D1, D2, D1a, and D2a, respectively. Each of the dummy transistors D1, D2, D1a, and D2a has their source and drain connected to the ground line 8a.

In the layout design of FIG. 6, the active transistors N1, N2, N1a, and N2a are not positioned, either, at the terminal portions of the fins 11 and 21 that are highly likely to have a narrower fin width as in the layout design of FIG. 4. This allows for eliminating the influence caused by tapering of the terminal portions of the fin 11 on the active transistors N1 and N2 and the influence caused by tapering of the terminal portions of the fin 21 on the active transistors N1a and N2a, thus reducing a variation in performance between the active transistors N1, N2, N1a and N2a.

Figure 7:
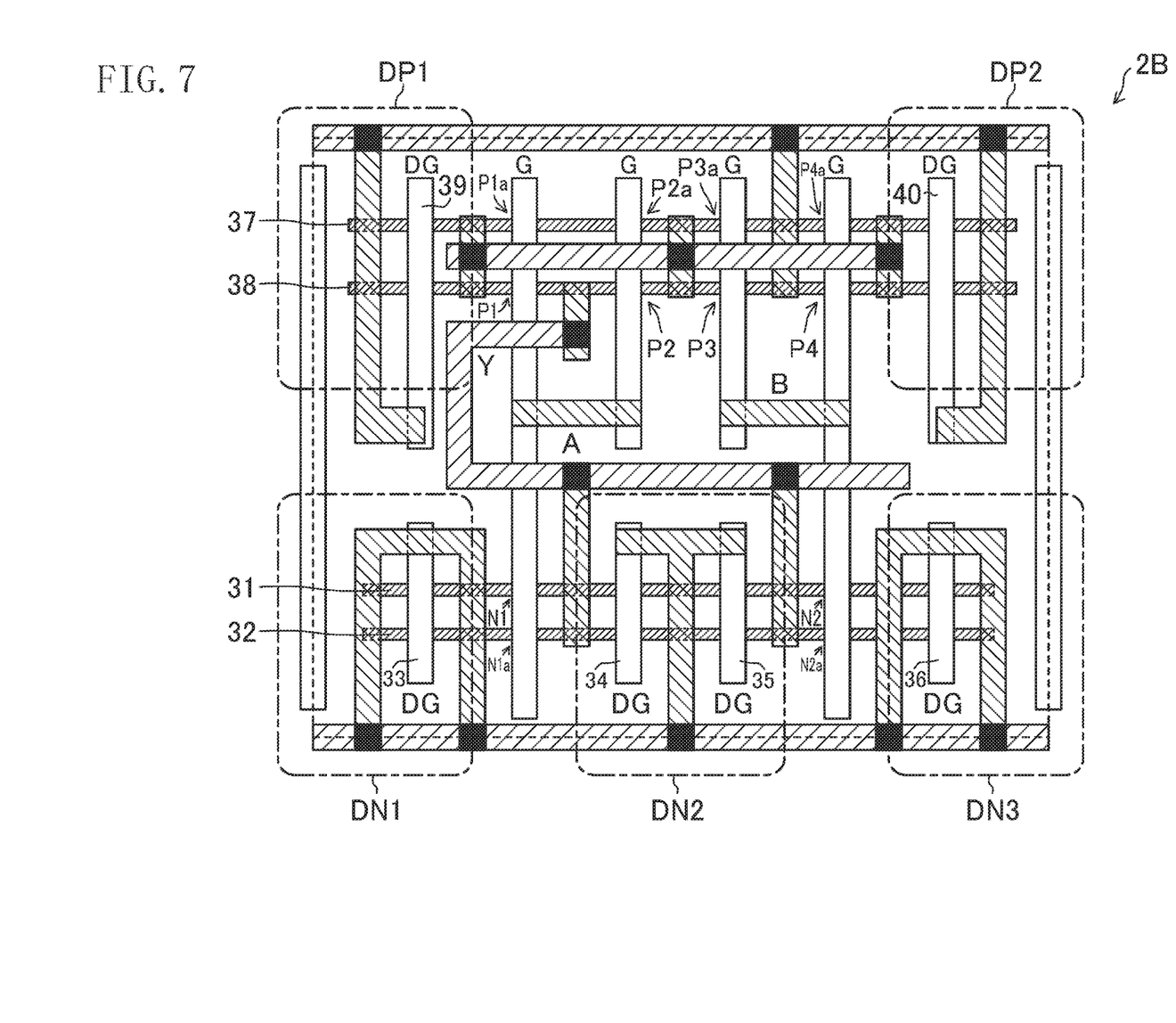
FIG. 7 is a plan view illustrating yet another exemplary layout design for a standard cell according to the second embodiment.

FIG. 7 is a plan view illustrating yet another exemplary layout design for a standard cell according to this embodiment. Although the standard cell 2B shown in FIG. 7 has the same circuit configuration as the one shown in FIG. 4, each of the n-channel transistors N1, N2, N1a, and N2a shares both nodes as its drain and source with associated ones of the dummy transistors. Each of the p-channel transistors P1, P4, P1a, and P4a has their drain connected to their associated dummy transistor's drain.

That is to say, in a region DN1, a fin 31 and a dummy gate line 33 constitute a dummy transistor sharing its source with the n-channel transistor N1, and a fin 32 and the dummy gate line 33 constitute a dummy transistor with which the n-channel transistor N1a shares its source. In a region DN2, the fin 31 and a dummy gate line 34 constitute a dummy transistor with which the n-channel transistor N1 shares its drain, and the fin 32 and the dummy gate line 34 constitute a dummy transistor with which the n-channel transistor N1a shares its drain. The fin 31 and a dummy gate line 35 constitute a dummy transistor with which the n-channel transistor N2 shares its drain, and the fin 32 and the dummy gate line 35 constitute a dummy transistor with which the n-channel transistor N2a shares its drain. In a region DN3, the fin 31 and a dummy gate line 36 constitute a dummy transistor with which the n-channel transistor N2 shares its source, and the fin 32 and the dummy gate line 36 constitute a dummy transistor with which the n-channel transistor N2a shares its source.

In a region DP1, a fin 37 and a dummy gate line 39 constitute a dummy transistor with which the p-channel transistor P1a shares its drain, and a fin 38 and the dummy gate line 39 constitute a dummy transistor with which the p-channel transistor P1 shares its drain. In a region DP2, the fin 37 and a dummy gate line 40 constitute a dummy transistor with which the p-channel transistor P4a shares its drain, and the fin 38 and the dummy gate line 40 constitute a dummy transistor with which the p-channel transistor P4 shares its drain.

The layout design of FIG. 7 also achieves the same or similar advantage as/to that in FIG. 4. In the layout design of FIG. 7, each of the active transistors N1, N2, N1a, N2a, P1, P2, P3, P4, P1a, P2a, P1a, and P4a shares both nodes as its source and drain with associated ones of the other transistors. All of them are thus arranged distant from the terminal portions of the fins 31, 32, 37, and 38. This allows for reducing a variation in performance between all the active transistors.

Other Exemplary Layout Designs

Figure 8:
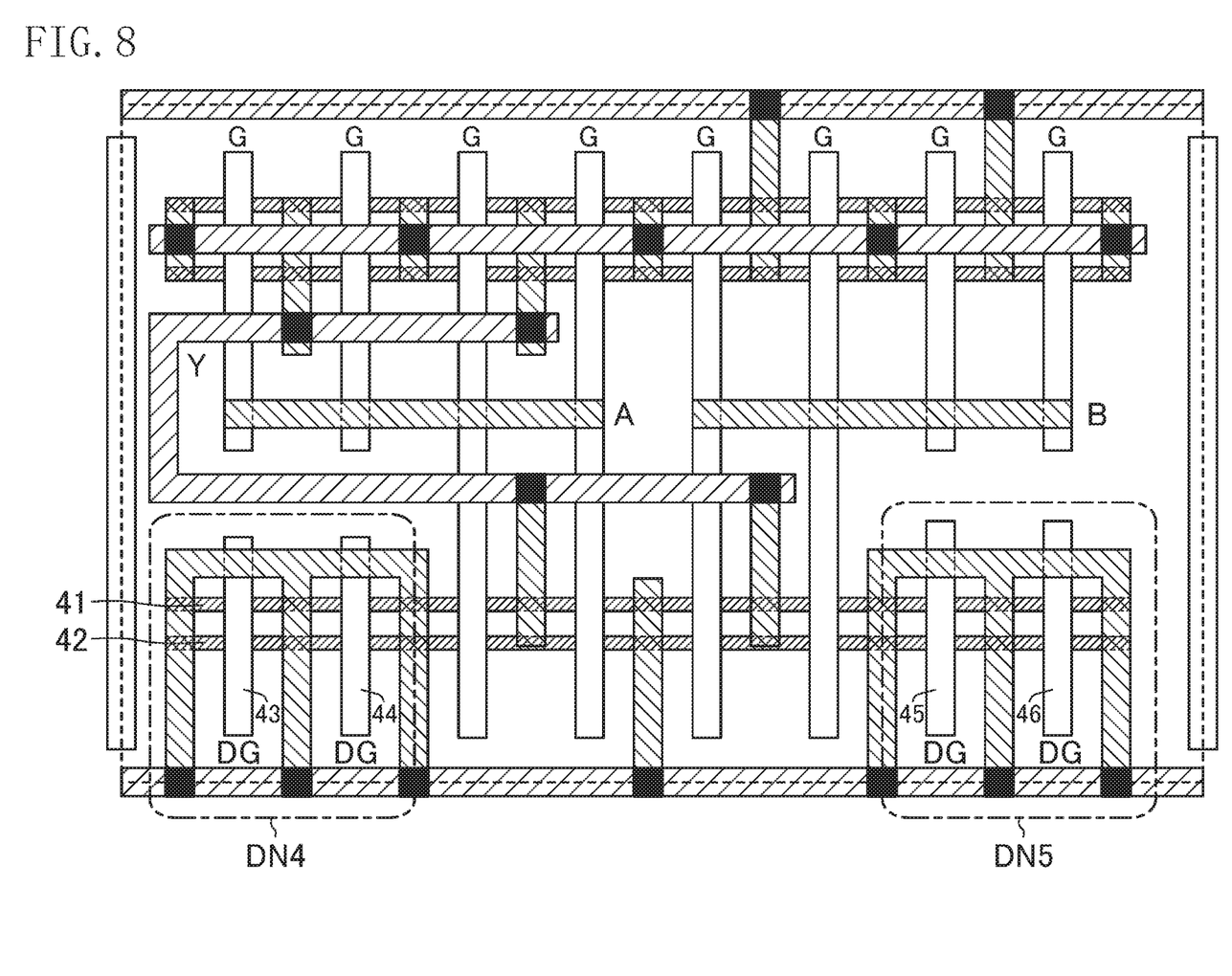
FIG. 8 is a plan view illustrating another exemplary layout design for a standard cell according to an embodiment.
Figure 9:
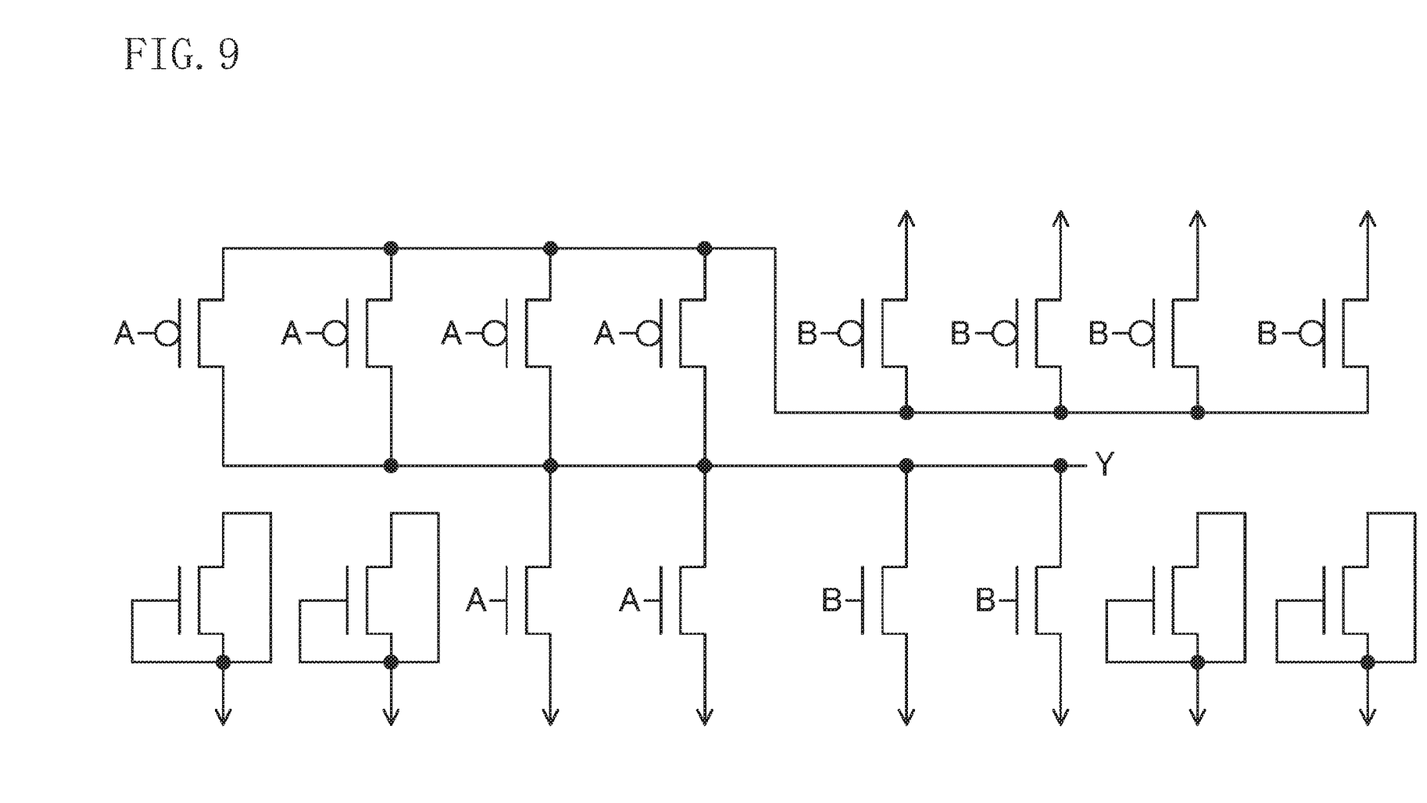
FIG. 9 is a circuit diagram of the standard cell of FIG. 8.

FIG. 8 is a plan view illustrating another exemplary layout design for a standard cell according to another embodiment. FIG. 9 is a circuit diagram of the standard cell of FIG. 8. In FIG. 8, each transistor of FIG. 9 uses two fins. In the layout design of FIG. 8, dummy transistors are formed at terminal portions of fins 41 and 42. In a region DN4 illustrated on the left-hand side of the paper, the fins 41, 42 and dummy gate lines 43, 44 constitute dummy transistors. In a region DN5 illustrated on the right-hand side of the paper, the fins 41, 42 and dummy gate lines 45, 46 constitute dummy transistors.

Figure 10:
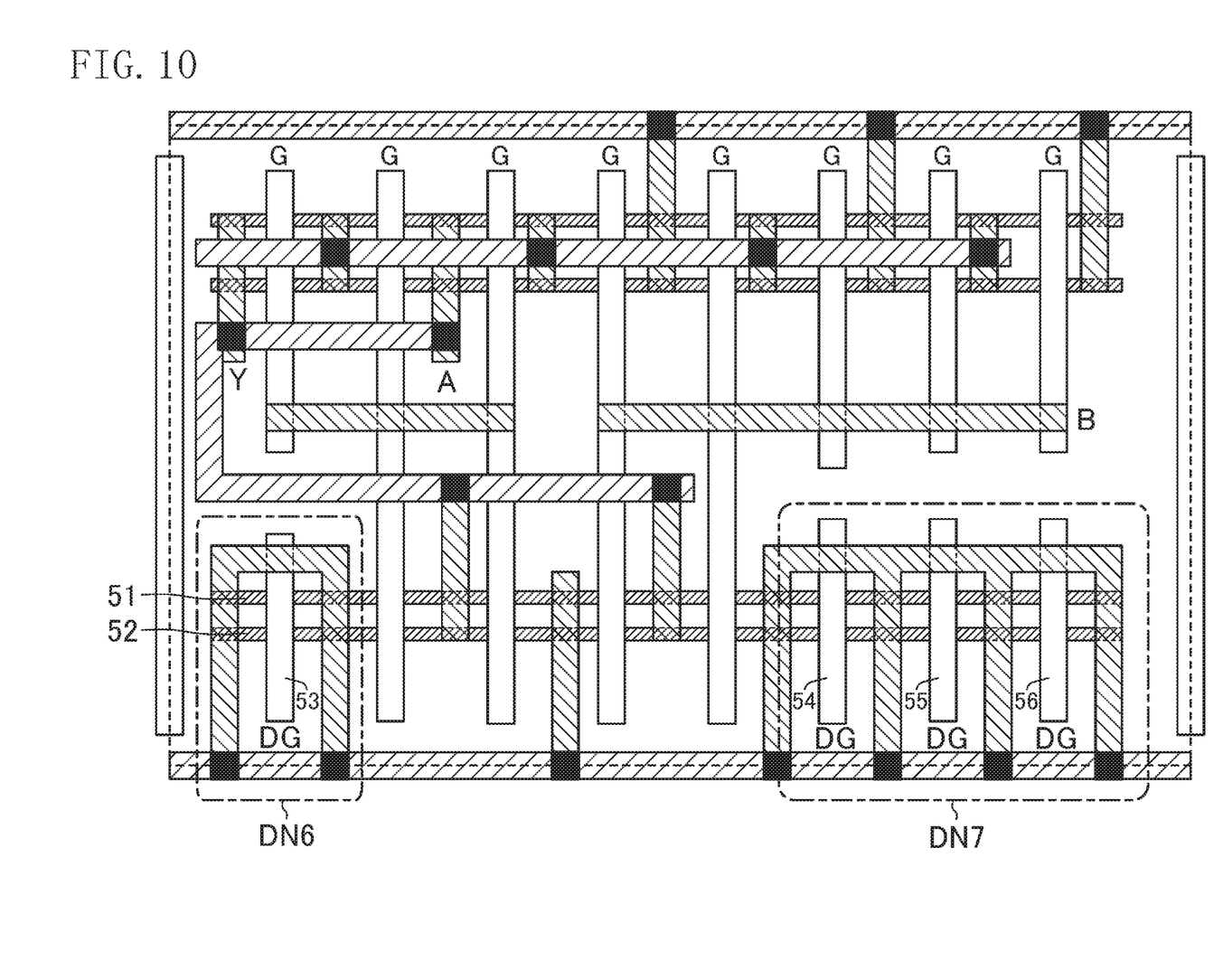
FIG. 10 is a plan view illustrating yet another exemplary layout design for a standard cell according to an embodiment.
Figure 11:
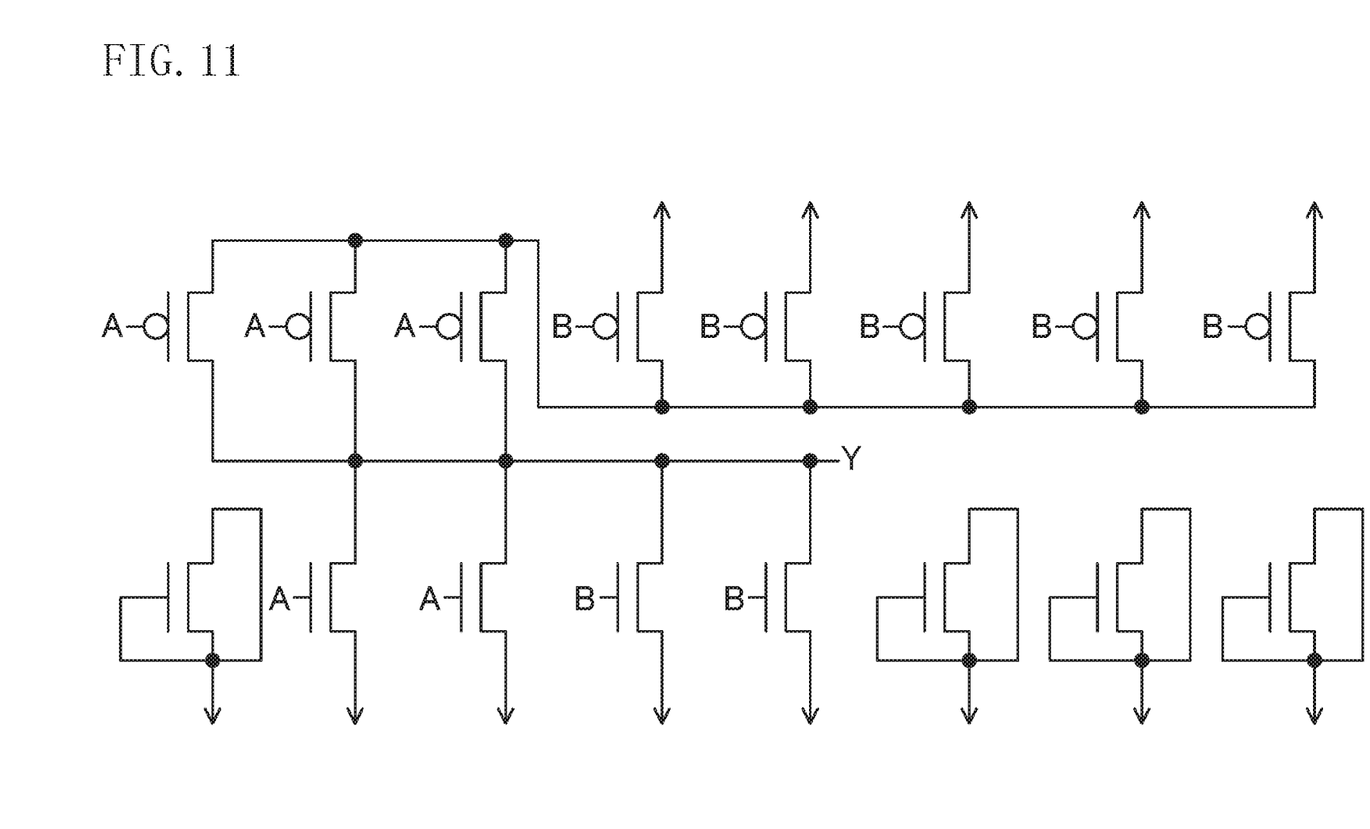
FIG. 11 is a circuit diagram of the standard cell of FIG. 10.

FIG. 10 is a plan view illustrating yet another exemplary layout design for a standard cell according to another embodiment. FIG. 11 is a circuit diagram of the standard cell of FIG. 10. In FIG. 10, each transistor of FIG. 11 uses two fins. In the layout design of FIG. 10, dummy transistors are formed at terminal portions of fins 51 and 52. In a region DN6 illustrated on the left-hand side of the paper, the fins 51, 52 and a dummy gate line 53 constitute a dummy transistor. In a region DN7 illustrated on the right-hand side of the paper, the fins 51, 52 and dummy gate lines 54, 55, 56 constitute dummy transistors.

In the foregoing description of embodiments, a NOR circuit has been described as an exemplary circuit according to the present disclosure, but this is only an exemplary embodiment of the present disclosure. For example, the present disclosure is also applicable in the same or similar manner to semiconductor integrated circuit devices performing other logical functions such as inverters, NAND gates, and flip-flops.

In the foregoing description of embodiments, if the dummy transistor is, e.g., an n-channel transistor, a ground potential is supplied to its gate to fix the gate potential. However, the present disclosure is not limited to this configuration. Alternatively, another configuration not contributing to any logical function may be adopted. For example, in the case of an n-channel transistor, a power supply potential may be supplied to its gate, and a ground potential may be supplied to its source and drain.

The present disclosure allows for reducing, in a semiconductor integrated circuit device including a standard cell having a fin transistor, the influence caused by tapering of the terminal portion of the fin. Thus, this is useful for reducing a variation in performance between the semiconductor integrated circuit devices.

What is claimed is:

1. A semiconductor integrated circuit device comprising:
a standard cell having a fin extending in a first direction, wherein
the standard cell comprises:
an active transistor including the fin and a gate line extending in a second direction perpendicular to the first direction and provided on the fin, nodes of the fin at both sides in the first direction of the gate line being source and drain of the active transistor; and
a dummy transistor including the fin and a dummy gate line provided on the fin in parallel with the gate line, nodes of the fin at both sides in the first direction of the dummy gate line being source and drain of the dummy transistor, and
the active transistor shares one of the nodes as its source or drain with the dummy transistor.

2. The semiconductor integrated circuit device of claim 1, wherein the standard cell comprises:
a third transistor including the fin and a second gate line provided on the fin in parallel with the gate line and opposite from the dummy gate line, nodes of the fin at both sides in the first direction of the second gate line being source and drain of the third transistor, and
the active transistor shares another of the nodes as its drain or source with the third transistor.

3. The semiconductor integrated circuit device of claim 2, wherein the third transistor functions as an active transistor.

4. The semiconductor integrated circuit device of claim 2, wherein the third transistor functions as a dummy transistor.

5. The semiconductor integrated circuit device of claim 1, wherein the node of the active transistor shared by the dummy transistor is its source to which a power supply potential is supplied.

6. The semiconductor integrated circuit device of claim 5, wherein the source and drain, and the dummy gate line of the dummy transistor are all connected to a power supply line.

7. The semiconductor integrated circuit device of claim 1, wherein the node of the active transistor shared by the dummy transistor is its drain, and the source and the dummy gate line of the dummy transistor are connected to a power supply line.

8. The semiconductor integrated circuit device of claim 1, wherein
the standard cell includes a second fin provided in parallel with the fin in a first conductivity-type region in which the fin is arranged,
the gate line and the dummy gate line extend to pass over the second fin,
the standard cell comprises:
a second active transistor including the second fin and the gate line, nodes of the second fin at both sides in the first direction of the gate line being source and drain of the second active transistor; and
a second dummy transistor including the second fin and the dummy gate line, nodes of the second fin at both sides in the first direction of the dummy gate line being source and drain of the second dummy transistor, and
the second active transistor shares one of the nodes as its source or drain with the second dummy transistor.

9. The semiconductor integrated circuit device of claim 1, wherein in the standard cell, in a first conductivity-type region in which the fin is formed, the active transistor includes a plurality of the active transistors, and each of all the active transistors shares both of the nodes as its source and drain with associated ones of other transistors.

10. The semiconductor integrated circuit device of claim 9, wherein the standard cell comprises:
a second fin extending in the first direction in a second conductivity-type region which is different from the first conductivity-type region, and
a plurality of second active transistors each including the second fin and a second gate line provided on the second fin, nodes of the second fin at both sides in the first direction of the second gate line being source and drain of the second active transistor,
in the standard cell, in the second conductivity-type region, each of all the second active transistors shares both of the nodes as its source and drain with associated ones of other transistors.

11. The semiconductor integrated circuit device of claim 1, wherein the standard cell is a cell functioning as constituent unit of a clock tree.

12. A semiconductor integrated circuit device comprising:
a standard cell having a first fin extending in a first direction and arranged in a first conductivity-type region and a second fin extending in the first direction and arranged in a second conductivity-type region which is different from the first conductivity-type region, wherein
the standard cell comprises:
a first active transistor including the first fin and a first gate line extending in a second direction perpendicular to the first direction and provided on the first fin, nodes of the first fin at both sides in the first direction of the first gate line being source and drain of the first active transistor;
a first dummy transistor including the first fin and a first dummy gate line provided on the first fin in parallel with the first gate line, nodes of the first fin at both sides in the first direction of the first dummy gate line being source and drain of the first dummy transistor; and
a second active transistor including the second fin and a second gate line extending in the second direction and provided on the second fin at the same position as the first gate line in the first direction, nodes of the second fin at both sides in the first direction of the second gate line being source and drain of the second active transistor;
the first active transistor shares one of the nodes as its source or drain with the first dummy transistor.

13. The semiconductor integrated circuit device of claim 12, wherein the standard cell comprises:
a second dummy transistor including the second fin and a second dummy gate line extending in the second direction and provided on the second fin at the same position as the first dummy gate line in the first direction, nodes of the second fin at both sides in the first direction of the second dummy gate line being source and drain of the second dummy transistor;
the second active transistor shares one of the nodes as its source or drain with the second dummy transistor.

14. The semiconductor integrated circuit device of claim 12, wherein the standard cell comprises:
a third transistor including the first fin and a third gate line provided on the first fin in parallel with the first gate line and opposite from the first dummy gate line, nodes of the first fin at both sides in the first direction of the third gate line being source and drain of the third transistor, and
the first active transistor shares another of the nodes as its drain or source with the third transistor.

15. The semiconductor integrated circuit device of claim 14, wherein the third transistor functions as an active transistor.

16. The semiconductor integrated circuit device of claim 14, wherein the third transistor functions as a dummy transistor.

17. The semiconductor integrated circuit device of claim 12, wherein the node of the first active transistor shared by the first dummy transistor is its source to which a power supply potential is supplied.

18. The semiconductor integrated circuit device of claim 17, wherein the source and drain, and the first dummy gate line of the first dummy transistor are all connected to a power supply line.

19. The semiconductor integrated circuit device of claim 12, wherein the node of the first active transistor shared by the first dummy transistor is its drain, and the source and the first dummy gate line of the first dummy transistor are connected to a power supply line.

20. The semiconductor integrated circuit device of claim 12, wherein in the standard cell,
in the first conductivity-type region, the first active transistor includes a plurality of the first active transistors, and each of all the first active transistors shares both of the nodes as its source and drain with associated ones of other transistors, and
in the second conductivity-type region, the second active transistor includes a plurality of the second active transistors, and each of all the second active transistors shares both nodes as its source and drain with associated ones of other transistors.

* * * * *